(12) United States Patent
Wimplinger (10) Patent No.: US 8,640,548 B2
(45) Date of Patent: Feb. 4, 2014

(54) APPARATUS, DEVICE AND METHOD FOR DETERMINING ALIGNMENT ERRORS

(75) Inventor: Markus Wimplinger, Ried im Innkreis (AT)

(73) Assignee: EV Group E. Thallner GmbH (AT)

( * ) Notice: Subject to any disclaimer, the term of this patent is extended or adjusted under 35 U.S.C. 154(b) by 44 days.

(21) Appl. No.: 13/512,723

(22) PCT Filed: Sep. 7, 2011

(86) PCT No.: PCT/EP2011/065492
§ 371 (c)(1),
(2), (4) Date: May 30, 2012

(87) PCT Pub. No.: WO2012/079786
PCT Pub. Date: Jun. 21, 2012

(65) Prior Publication Data
US 2012/0255365 A1    Oct. 11, 2012

(30) Foreign Application Priority Data

Dec. 13, 2010  (EP) .................................... 10015569

(51) Int. Cl.
*G01B 5/30*    (2006.01)
*G01B 7/16*    (2006.01)
*G01L 1/00*    (2006.01)
*G01N 3/00*    (2006.01)

(52) U.S. Cl.
USPC .......................................................... 73/760

(58) Field of Classification Search
USPC .......................................................... 73/760
See application file for complete search history.

(56) References Cited

U.S. PATENT DOCUMENTS

| 2005/0255666 A1 | 11/2005 | Yang .............................. 438/401 |
| 2007/0029365 A1* | 2/2007 | Paul et al. ...................... 228/101 |
| 2007/0212856 A1* | 9/2007 | Owen ............................ 438/478 |
| 2007/0252994 A1 | 11/2007 | Bijnen et al. ................... 356/401 |
| 2009/0239733 A1* | 9/2009 | Kwon et al. ...................... 501/53 |

FOREIGN PATENT DOCUMENTS

| EP | 1 705 705 | 9/2006 | .............. H01L 27/12 |
| WO | WO2009/133682 | 11/2009 | .............. H01L 21/02 |

OTHER PUBLICATIONS

Article entitled: "Novel Alignment System for Imprint Lithography," from Journal of Vacuum Science and Technology, Part B, AVS/AIP, Melville, New York NY; Bd. 18 Nr. 6; dated Nov. 1, 2000, pp. 3552-3556; (Doc. No. XP-002204287).
Int'l Search Report (German version only) from corresponding PCT/EP2011/065492 (Form PCT/ISA/210 and PCT/ISA/237); 9 pages.

* cited by examiner

*Primary Examiner* — Lisa Caputo
*Assistant Examiner* — Jamel Williams
(74) *Attorney, Agent, or Firm* — Kusner & Jaffe (57) ABSTRACT

The invention relates to an apparatus, a device and a method for determining local alignment errors which have occurred due to strain and/or distortion of a first substrate relative to a second substrate when the first substrate is joined to the second substrate and for alignment of two wafers by means of position maps, strain maps and/or stress maps of wafers which are recorded during and/or after alignment of the wafers, especially through at least one transparent region of at least one of the wafers, optionally the relative position of the two wafers to one another being corrected especially in-situ.

14 Claims, 5 Drawing Sheets

APPARATUS, DEVICE AND METHOD FOR DETERMINING ALIGNMENT ERRORS

FIELD OF THE INVENTION

The invention relates to an apparatus for determining local alignment errors which have occurred due to strain and/or distortion of a first substrate relative to a second substrate when the first substrate is joined to the second substrate. Moreover the invention relates to a device for detecting and/or predicting distortions, especially the alignment of distortions which influence the substrates and of substrates as well as a device for alignment and/or inspection of the alignment of the first contact surface of a first substrate with a second contact surface of a second substrate and a method for determining alignment errors.

BACKGROUND OF THE INVENTION

In the earlier European patent application 09012023.9 the basic problems which exist during alignment are described on pages 1 to 3.

Due to the 3D technology which is becoming more and more important in combination with progressing miniaturization, it is becoming more and more important in bond processes to carry out a correct alignment process, especially coupled with a so-called pre-bonding step which connects the wafers to one another by means of a separable connection prior to the actual bond process. This is important mainly in applications in which alignment accuracies of better than 2 μm for all locations on the wafer are desired. The importance and requirements for accuracy of the alignment technology and of the pre-bonding process increase greatly for desired accuracies less than 1 μm, especially less than 0.5 μm or less than 0.25 μm.

Based on the fact that the structures are becoming smaller and smaller, but the wafers at the same time are becoming larger and larger, there can be structures which are very well aligned to one another in the vicinity of alignment marks, while at other positions of the wafer the structures have not been correctly or at least not optimally joined to one another. In order to optimally join the structures on both sides of the wafer to one another, very complex alignment technologies coupled to very well monitored and optimized bonding technologies, especially pre-bonding technologies, are being developed.

Current technology is intended to record some alignment marks on one side of two wafers at a time and to align the two wafers afterward using these alignment marks and to bond them. Here several problems arise, depending on the respective technology which is used for the alignment.

The applicant with European application EP 09012023.9 has already filed a method using which it is possible to measure the entire surface of a wafer in order to obtain information about the positions of the structures on the surface of each wafer.

The object of this invention is to develop a generic device or a generic method such that higher detection relating especially to the entire surface of the wafer for more exact alignment is achieved and errors in the detection of positions or later alignment are minimized. In addition the object of this invention is to increase the throughput in the detection of the positions and the alignment of wafers.

This object is achieved with the features of Claims 1, 4, and 8. Advantageous developments of the invention are given in the dependent claims. All combinations of at least two of the features given in the specification, the claims and/or the figures also fall within the framework of the invention. At the given value ranges, values within the indicated limits will also be disclosed as boundary values and will be claimed in any combination.

SUMMARY OF THE INVENTION

The invention is based on the idea of recording position maps, strain maps and/or stress maps of the substrates, especially wafers, before, during and/or after the alignment of the substrates, especially to observe them through at least one transparent region of at least one of the substrates, and optionally to correct the relative position of the two substrates to one another, especially in-situ.

Maps are defined as properties, especially values, at certain X-Y positions of the substrates along a surface.

The basic idea is to determine at least one strain map of strain values along at least one of the substrates after joining the substrates, and with the determined strain values local alignment errors can be determined. Local alignment errors relate preferably to local structures or groups of local structures of the substrates.

As claimed in the invention, a displacement map of the substrate or the two substrates is prepared for the displacements caused by the joining of the substrates. The displacements are caused especially by distortions and/or strains of the substrates.\

The basic idea is to be able estimate how serious (→distortion vectors) the distortion introduced by the pre-bonding step or joining step is, especially at a plurality of local positions on the respective substrate, preferably at positions dictated by a position map of the respective substrate. The alignment accuracy which has actually been achieved after the pre-bonding can be measured using the transparent window, but this indicates, as described below, only little about the actually achieved accuracy on the entire wafer since it is these distortions which can degrade the result. Since the wafers are not transparent to infrared radiation, the alignment accuracy cannot be directly measured. According to the invention this is estimated by means of detecting the stress maps and/or the strain maps.

One important aspect is that the apparatus as claimed in the invention (or measurement device) in one preferred embodiment is provided separately from the alignment device as an independent module.

In one preferred embodiment the module division is as follows:
1) module for detecting a stress and/or strain map before joining (bonding or pre-bonding)
2) alignment module especially according to European patent application EP 09012023.9. But wafer alignment could also take place using only two alignment marks. In this case the position maps would not be detected by real measurement, but would be known based on the wafer layout.
3) at least one measurement module for detecting the stress maps after bonding.

Aside from this application, as claimed in the invention another embodiment likewise described below in the disclosure is conceivable in which one of the two wafers is largely unstructured, i.e. has at maximum alignment marks. In this case it is a matter of being able to estimate distortions of the structured wafer. In this embodiment there is no "measured" position map, but only information or data about existing distortions of the exposure fields and information on where these exposure fields are located on the wafer. These data are "read in" and would be known on the one hand from the wafer layout (positions). The already existing distortions are measured with a measurement device which is suitable for this purpose (generally the lithography system is used for this purpose).

In this embodiment the focus can be less on the alignment (exact alignment) (one of the wafers is largely unstructured), but only distortions of the structured wafer are relevant. The alignment between the two wafers is either only coarse here (mechanical—edge to edge) or optical (by means of the alignment marks which are applied to largely unstructured wafers).

The demands on the optical alignment are however generally rather low.

The position maps are recorded/detected in one advantageous version as in the earlier application EP 09012023.9 which is described again here.

It describes a method in which the X-Y positions of alignment keys of two substrates which are to be aligned can be detected or measured in at least one X-Y coordinate system which is independent of the movement of the substrates so that the alignment keys of a first substrate can be aligned by correlation of the pertinent alignment keys of a second substrate into the corresponding alignment positions. Thus a position map of each substrate which is to be aligned is prepared.

In other words: The device makes available means for detecting the movement of the substrates, especially exclusively in an X- and Y-direction, which are references to at least one fixed, especially locally fixed reference point and thus at least in one X- and Y-direction enable an exact alignment of the corresponding alignment keys.

The position map can be recorded with the following steps:
arrangement of the first contact surface in a first X-Y plane and of the second contact surface in a second X-Y plane which is parallel to the first X-Y plane,
detection of X-Y positions of first alignment keys which are located along the first contact surface in a first X-Y coordinate system which is independent of the movement of the first substrate by first detection means and detection of X-Y positions of second alignment keys which are located along the second contact surface and which correspond to the first alignment keys in a second X-Y coordinate system which is independent of the movement of the second substrate by second detection means,
alignment of the first contact surface in a first alignment position which is determined based on the first X-Y positions and alignment of the second contact surface in a second alignment position which lies opposite to the first contact surface and which is determined based on the second X-Y positions.

This also applies especially to the recording and movement of wafers on the platforms and the coordinate systems and their relation to one another which can also be used for recording/detecting the strain maps and/or stress maps if nothing to the contrary is described here.

By the combination of positions maps, strain maps and/or stress maps, especially in conjunction with the transparent regions, it is possible to detect faulty alignment which occurs after or due to contact of the wafers, especially after or during the pre-bonding step and to separate the wafers from one another again or to separate them from the production process.

One problem is that with existing technologies, conventionally only a very highly limited number of alignment marks is detected. Conventionally the alignment is carried out only using 2 alignment marks. This can then result in the above described adverse effects that the alignment can be good at the locations of the alignment marks and in the regions directly adjacent to the alignment marks, while the alignment in the remaining regions of the wafer can be inadequate.

Another problem consists in that depending on the selected bond process both in pre-bonding of the wafers and also in final bonding of the wafers, mechanical distortions can occur on one or two wafers which can lead either locally or even globally to degradation of the alignment accuracy. The importance/effect of these distortions with respect to successful alignment of the wafers increases with the required alignment precision, especially for required accuracies better than 2 μm. For alignment accuracies >2 μm these distortions are small enough not to represent a significant effect on the alignment result.

These distortions constitute a problem not only in the bonding of two structures substrates, but can also lead to major problems in bonding of a structured substrate onto a largely unstructured substrate. This is especially the case if, after bonding, other process steps which require a very accurate alignment to the structured substrate are to be carried out. In particular, lithography steps in which additional layers of structures are to be aligned to structures already existing on the substrate impose high demands here. These demands rise with decreasing structure size of the structures to be produced. This application arises for example in the production of so-called "backside illuminated CMOS image sensors". Here a first wafer with the already structured surface is bonded onto a carrier wafer which is especially largely unstructured. After forming a permanent bond connection, most of the wafer material of the structured wafer is removed so that the structured surface, especially the light-sensitive sites, become accessible from the back. Subsequently this surface must be subjected to other process steps, especially lithography, in order for example to apply the color filters which are necessary for operation of the image sensor.

Distortions of these structures adversely affect the alignment accuracies which can be achieved in this lithography step. For the current generation of image sensors with a pixel size of for example 1.75 μm or 1.1 μm, the distortions allowable for an exposure field (up to 26×32 mm) of a step and repeat exposure system are roughly 100 nm, still better 70 or 50 nm.

Pre-bonding in this document designates bonding connections which after the completed pre-bonding step still allow separation of the substrates, especially of the wafers, without irreparable damage of the surfaces. Therefore these bond connections can also be called reversible bond. This separation is conventionally possible based on the fact that the bond strength/adhesion between the surfaces is still relatively low. This separation is conventionally possible until the bond connection is permanent, i.e. no longer separable (non-reversible). This is especially attainable by the passage of a certain time interval and/or action on the wafers from the outside by means of physical parameters and/or energy. Here especially the compression of the wafers by means of a compressive force or the heating of the wafers to a certain temperature or exposure of the wafers to microwave irradiation are suitable. One example for this pre-bond connection would be a connection between a wafer surface with thermally produced oxide and a wafer surface with native oxide, van-der-Waals connections between the surfaces occurring here at room temperature. These bond connections can be converted into permanent bond connections by temperature treatment. Advantageously these pre-bonding connections also allow inspection of the bonding result before forming of the permanent bond connection. In the case of deficiencies ascertained in this inspection the substrates can be separated again and rejoined.

In the simplest embodiment the invention is a measurement device and measurement method which enable detection of the stresses introduced by the pre-bonding step in a wafer or a wafer pair. This takes place by means of analysis of the stress maps before and after bonding. A stress difference map is produced therefrom according to the following description.

The stress difference map enables an especially empirical estimate of the distortion/strain introduced by the pre-bonding step. A distortion vector field or a distortion map/strain map is produced therefrom.

This distortion vector field as claimed in the invention makes it possible for wafer pairs in which only one of the two wafers is structured to determine which distortions were produced at certain positions, especially on the corners of the exposure field, preferably at the positions of the alignment marks for the lithography device, in addition to the deviations from the ideal shape which already exist before bonding.

The distortion vector field alternatively makes it possible, for wafer pairs with two structured wafers, to predict which additional alignment deviations can be expected at the points detected in the position maps in addition to the already theoretically expected (as a result of the selected ideal alignment positions based on the position maps of the two wafers) deviation vectors. This yields a deviation vector field or a displacement map.

In one preferred embodiment this expected deviation vector field is superimposed or added to the deviations which have been determined based on measurements in the transparent windows. This results then in the alignment result which is to be ultimately expected for all correspondingly provided positions of the position map. With this result a decision can be made whether the joined wafers are to be separated again.

The invention is furthermore based on the idea of devising a device and a method in which each alignment position of the two wafers to one another can be determined, with which the set of all structures on the contact surfaces of the wafers to one another are economically and/or technically optimum to one another. This relative position can, but need not necessarily, correlate with a perfect alignment of the alignment marks to one another. Of course the alignment marks are also almost always in the optimum position, i.e. at least relative to the μm range in the immediate vicinity, but even not necessarily perfect.

for already completed "prebond" process, therefore in a state in which it is still possible to separate the two wafers from one another, it can be checked whether the stresses produced in the pre-bonding step and the distortions which probably derive therefrom, especially mechanical distortions, are at an acceptable order of magnitude. This is used especially in applications in which only one of the two wafers is structured and the second wafer is largely unstructured.

for already completed "prebond" process, therefore in a state in which it is still possible to separate the two wafers from one another, it can be checked whether the accuracy of positioning of the two wafers or of the individual structures of the wafers to one another also in fact correspond to specifications. In this way, the displacements which occur as the wafers mutually approach one another in the direction of the z-axis, or even worse, deviations from the ideal position which occur during the contact process, can be determined. In particular, as a result of detecting the stresses introduced in the pre-bonding step, predictions of the expected distortions and the resulting deviations from the ideal position can also be estimated, especially empirically.

With this device and this method alignment accuracies of <25 μm, especially <0.15 μm, preferably <0.1 μm can be accomplished with good reliability and yield by the above described distortions being controllable and correctable optionally before producing the final bond connection.

In other words, the device therefore makes available at least means for detecting the stress properties of the wafers before and/or after the pre-bonding step. Based on the knowledge of these stress properties and especially a comparison of the stress properties before and after the pre-bonding step, predictions can be made about strains/distortions which have been introduced into the wafer during the pre-bonding step.

In another embodiment, especially for the inspection and/or alignment of two structured wafers, the device makes available means for detecting the movement of the substrates, especially solely in one X and Y direction which are referenced to at least one fixed, especially locally fixed reference point and thus enable exact alignment of the corresponding alignment keys at least in one X and Y direction, not only with reference to the positions of the individual structures, but also with respect to the strain and/or stress properties.

The features of the invention which is presented here consist on the one hand in that the economically and/or technically optimum alignment of all structures of the two wafers to one another can be determined, measured and/or checked. This comprises the recording of a position map of the structures of the two wafers before the wafers are brought together, especially according to earlier European patent application 09012023.9, and a continuous, especially in-situ monitoring process of the displacement of the two wafers via alignment marks. For faulty prealignment and prebond the generally very expensive structure wafers can be again separated from one another and re-aligned.

In one advantageous embodiment of the invention it is provided that the apparatus is made to take into account first position maps of first alignment keys and/or second position maps of second alignment keys, especially in the determination by evaluation means. Alignment keys are especially the alignment marks and/or structures applied to the substrates or one of the substrates.

The stress and/or strain maps are recorded either from the respective inspection side by reflection measurement, the radiation being reflected. In particular an average value of the stress/strain over the layer thickness is not enabled, but information about regions near the surface, light infrared or from the respective back by transmission measurement is enabled as claimed in the invention. In measurement with infrared light or x-ray an average value of the stress or strain over the detectable layer thickness is determined. A stress-strain map is not necessarily recorded through the transparent regions. The position maps are determined especially solely by reflection measurement, preferably by using visible light. The first and second alignment keys can be detected at the same time, especially with the same detection means, by the aforementioned measures.

According to another advantageous embodiment of the invention, it is provided that the alignment of the substrates during contacting and/or bonding of the substrates can be checked, especially in-situ. The in-situ checking entails the advantage that alignment errors caused especially by movement of the substrates during contact or bonding can be precluded.

To the extent four corresponding alignment keys are provided for checking, checking taking place especially through transparent regions, simultaneous in-situ monitoring of the relative position of the substrates to one another can also take place.

Other advantages, features and details of the invention will become apparent from the following description of preferred exemplary embodiments and using the drawings.

DETAILED DESCRIPTION OF PREFERRED EMBODIMENTS

In the figures the same components and parts with the same function are identified with the same reference numbers.

Figure 1A:
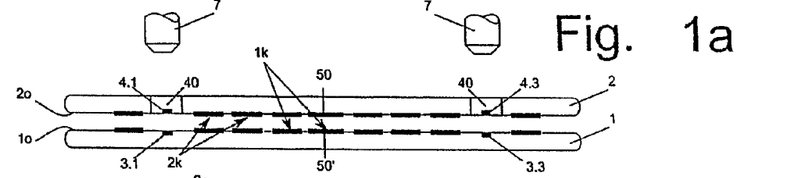
FIG. 1a shows a schematic cross sectional view of a wafer pair which has been aligned as claimed in the invention.
Figure 1B:
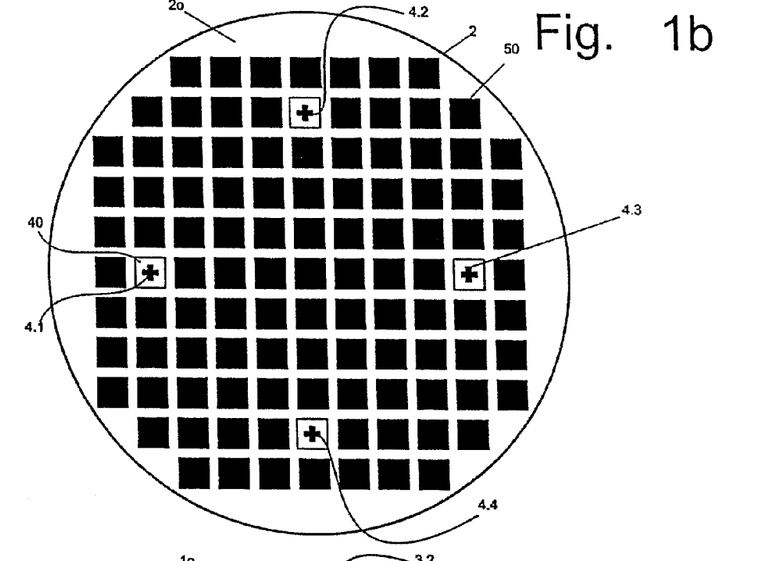
FIG. 1b shows a schematic aspect of an upper wafer of the wafer pair according to FIG. 1a, FIG. 1c shows a schematic aspect of a lower wafer of the wafer pair according to FIG. 1a, FIG. 2a shows a schematic view of the process step of detecting a first wafer as claimed in the invention.
Figure 1C:
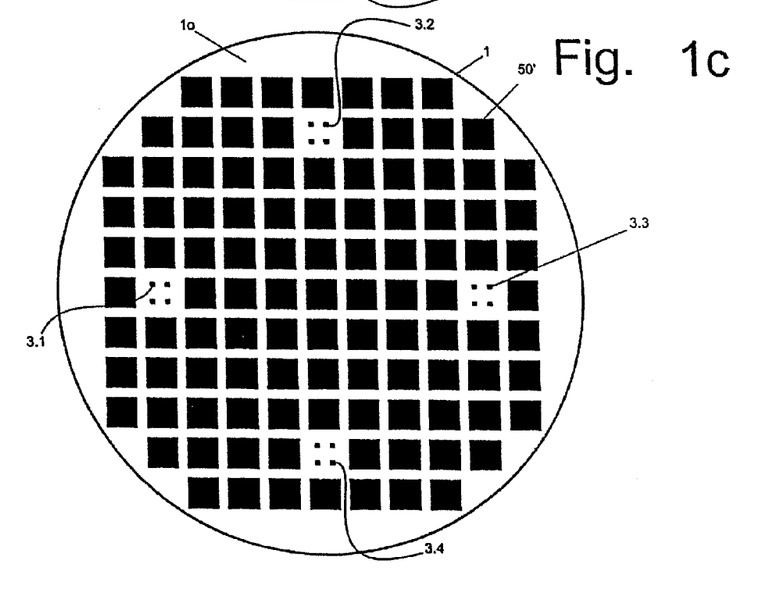

FIG. 1a shows a typical wafer system consisting of a first substrate 1, especially a wafer 1, with a surface 1o, and a second substrate 2, especially a wafer, with a surface 2o. On the surfaces 1o, 2o are different structures 50, 50' which are to be bonded to the contact surfaces 1k, 2k. The structures 50, 50' can be for example cavities in which there are MEMS devices. In the case of 3D integrated chip stacks the structures could also be metal surfaces which are used for producing electrical connections. For the sake of simplicity the structures 50, 50' are shown as black rectangles. FIGS. 1b and 1c show the surfaces 1o, 2o of the two wafers 1, 2. The wafer 2 has four regions 40 with second alignment keys 4.1 to 4.4.

The regions 40 are transparent to electromagnetic radiation of a certain wavelength or a certain wavelength range. A first detection means 7, especially optics, can correlate the first alignment keys 3.1 to 3.4 of the first wafer 1 with the corresponding second alignment keys 4.1 to 4.4 through the transparent regions 40. Advantageously these transparent regions can be made available for silicon wafers by doping of the silicon being avoided for these regions or especially the degree of doping being kept relatively low and no metal layers being applied in these regions or especially relatively few metal structures being produced. This can be achieved for example in that only the alignment marks and possible pertinent structures which can consist especially of metal are placed in the transparent regions. With adherence to these prerequisites silicon is transparent to infrared light with a wavelength of >1 µm, especially >1050 nm.

The structures 50, 50' can project over the surfaces 1o, 2o or can be set back relative to them, for which reason the contact surfaces 1k, 2k need not coincide with the surfaces 1o, 2o of the wafers 1, 2.

Alignment keys 3.1 to 3.n or 4.1 to 4.n can be also be the structures 50, 50' or parts of the structures 50, 50'.

The method begins with the recording of the position maps. A position map is defined as the position detection, spatially as complete as possible, of as many structural elements as possible, especially of the first and/or second alignment keys 3.1 to 3.n or 4.1 to 4.n and/or structures 50, 50' or parts of the structures 50, 50' on the surface of the wafers 1, 2.

Figure 2A:
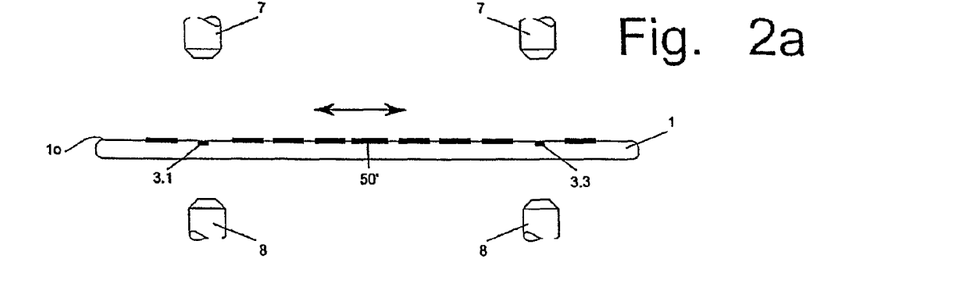

FIG. 2a shows the position detection of the surface 1o of the first wafer 1 by the optics 7, therefore the recording of a first position map. Positions of the first alignment keys 3.1 to 3.4 are measured on the top 1o of the wafer 1 by either the wafer 1 being moved relative to the optics 7 or the optics 7 being moved relative to the wafer 1. In one preferred embodiment the optics 7 are fixed, while the wafer 1 is moved relative to the optics 7, fixed on the recording means 12.

Figure 2B:
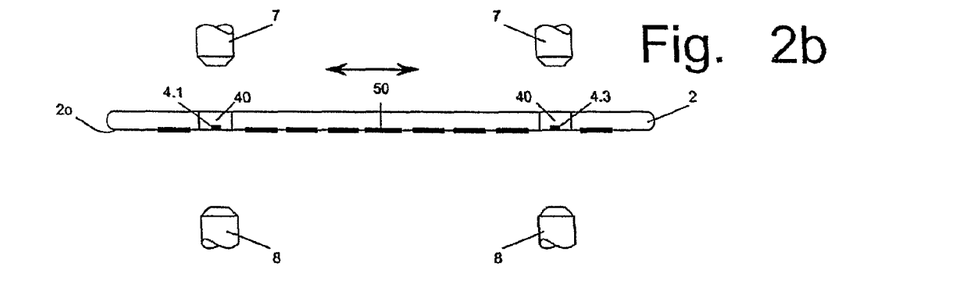
FIG. 2b shows a schematic view of the process step of detecting a second wafer as claimed in the invention.
Figure 2C:
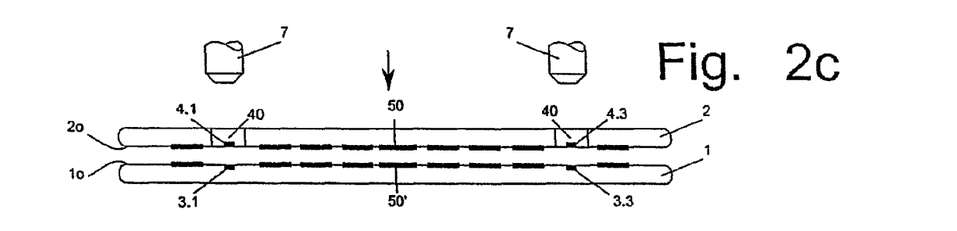
FIG. 2c shows a schematic view of the in-situ detection of the alignment of the wafers as claimed in the invention when the wafers make contact.

In a second step which especially follows the first step or which proceeds simultaneously with it, according to FIG. 12b the same process is carried out with the top 2o of the second wafer 2 by means of a second detection means, especially optics 8.

Since in this measurement process the recording of the position map is what is important, it would also be conceivable to use only the optics 7 as the detection means, therefore to omit the optics 8, and to measure the two wafers 1, 2 with their structured tops 1o, 2o in the direction of the optics 7. For later alignment and bond step then one of the two wafers 1, 2 would be flipped and fixed on its recording means 12 or 22.

According to the above described steps, the device now knows the X-Y positions of all recorded structures 50, 50' or recorded first and second alignment keys 3.1 to 3.n and 4.1 to 4.n on the tops 1o, 2o of the wafers 1, 2, especially also the positions of the structures 50, 50' relative to the first and second alignment keys 3.1 to 3.n and 4.1 to 4.n. They are stored in the form of a first position map for the first substrate 1 and in the form of a second position map for the second substrate 2.

During the measurement step as claimed in the invention, not only the first and second position map, but especially in different modules or at the same time in one module, also first and second initial strain and/or first and second initial stress maps will be recorded and are representative of the basic stresses or initial stresses of the substrates 1, 2. Here it is the recording of strain and/or stress values as a function of the X-Y position according to the position map. Each measurement device which is able to determine stresses and/or strains locally resolved, can be used, especially infrared measuring devices. Measurement devices which are based on Raman spectroscopy are especially advantageously used. Alternatively as claimed in the invention the infrared method "Grey-Field Polariscope" Review of Scientific Instruments 76, 045108 (2005) "Infrared grey-field polariscope: A tool for rapid stress analysis in microelectronic materials and devices" can be used. The stress and/or strain maps are recorded in turn by relative motion of the optics 7, 8 to the wafers 1, 2. In one advantageous embodiment there is separate optics or optics additionally integrated in the optics 7, 8.

To the extent only strain maps or only stress maps are prepared for optimization of the detection time, the stress map can be converted into the corresponding strain map by means of the fundamental equations of elasticity theory and vice versa. A mathematical, especially numeric conversion, preferably with starting points according to the method of finite elements is conceivable as claimed in the invention.

For devices which have been optimized for the especially precise detection of the position maps and/or strain maps, two different detection means are used for detection of the position maps and/or stress maps.

According to the invention and for exclusion of other fault sources it is provided that the stress and/or strain maps are detected according to the alignment of the substrates 1, 2.

The respective detection means for recording the position maps in one advantageous configuration at the same time comprise the detection means for detection of the stress and/or strain maps so that movement of the respective detection means with the same drive takes place.

Alternatively, for the accelerated and in this respect more cost favorable embodiment it is conceivable to provide detection of the stress and/or strain maps in one or more separate modules, especially with respectively separate wafer handling means, preferably robot arms.

Figure 3:
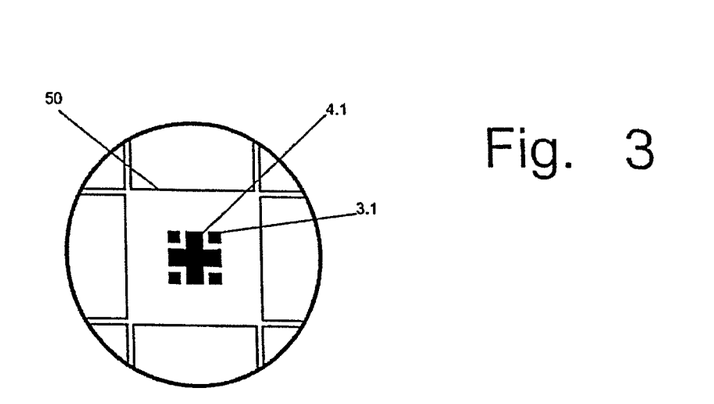
FIG. 3 shows an enlargement of one alignment mark for a perfectly aligned and contacted wafer pair.

FIG. 3 shows perfectly aligned first and second alignment keys 3.1 to 4.1, as well as perfectly aligned structures 50, 50', the structure 50 being covered by the structure 50' due to the perfect overlapping. The case is unrealistic in which all structures 50, 50' on the two wafers 1, 2 with reference to the alignment keys 3.1 to 3.n and 4.1 to 4.n have been produced so perfectly that in a perfect bond process the state from FIG. 3 results. In actuality the structures 50, 50' cannot be so exactly produced. Even if they were so perfectly produced, the wafers 1, 2 during the approach process or while "coming into contact" could move relative to one another. In the pre-bonding step additional strains can also be introduced into the wafer which lead to strain/distortions and as a further consequence to deviations from the ideal alignment. As claimed in the invention, a perfect alignment at individual positions is accordingly not necessarily the objective. Rather as claimed in the invention care should be taken that all corresponding structures 50, 50' on the wafers 1, 2 are aligned altogether with regard to economic and/or technical aspects such that for each wafer pair which is to be bonded and aligned dice scrap is as little as possible.

Since the positions of all detected structures 50, 50' and/or of the first and second alignment keys 3.1 to 3.4 and 4.1 to 4.4 of the two wafers 1, 2 are known, the optimum relative position of the wafers 1, 2 or of all structures 50, 50' to one another can be determined by computation means. This takes place by determining a first alignment position of the first contact surface $1k$ and a second alignment position of the second contact surface $2k$ based on the values of the first position map and based on the values of the second position map. This relative position of the wafers 1, 2 to one another and/or the first and second alignment position can be continuously checked in-situ for correctness during and also after contacting and during as well as after the bonding process by the optics 7 and through the transparency regions 40. In this way the alignment can be checked in-situ.

The optimum relative position of the two wafers 1, 2 or of the structures 50, 50' to one another arises for example by computing a minimum sum of the especially quadratic deviations of the respectively corresponding structures 50, 50' from one another.

As claimed in the invention, it is likewise conceivable to allow economic aspects to also be included in this computation of the ideal alignment position. Thus, in many areas of the semiconductor industry, especially in the memory industry (for example, RAM, NAND Flash) it is conventional that chips on certain regions within the wafer, especially in the region of the wafer center, have less variance of the quality-relevant parameters. Therefore the chips which originate from this region attain higher sales prices so that the sorting process in which these chips are intentionally divided into different quality baskets is taken into account (this process is known as "binning"). Advantageously therefore as claimed in the invention the ideal alignment position of the wafers is computed not only based on the position maps of the two wafers, but an economic computation/weighting is also included here, in which especially care is taken to achieve a higher yield in the area of the higher quality chips, especially at the cost of a lower yield in the region of the lower value chips.

Figure 4:
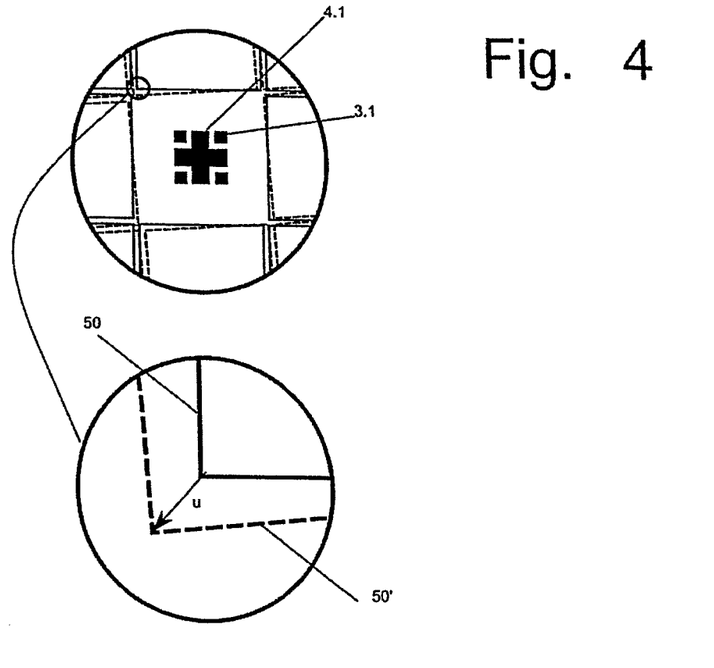
FIG. 4 shows an enlargement of one alignment mark for an imperfectly aligned and contacted wafer pair with an enlargement of corners of two structures of the wafer pair which are to be aligned to one another.
Figure 6:
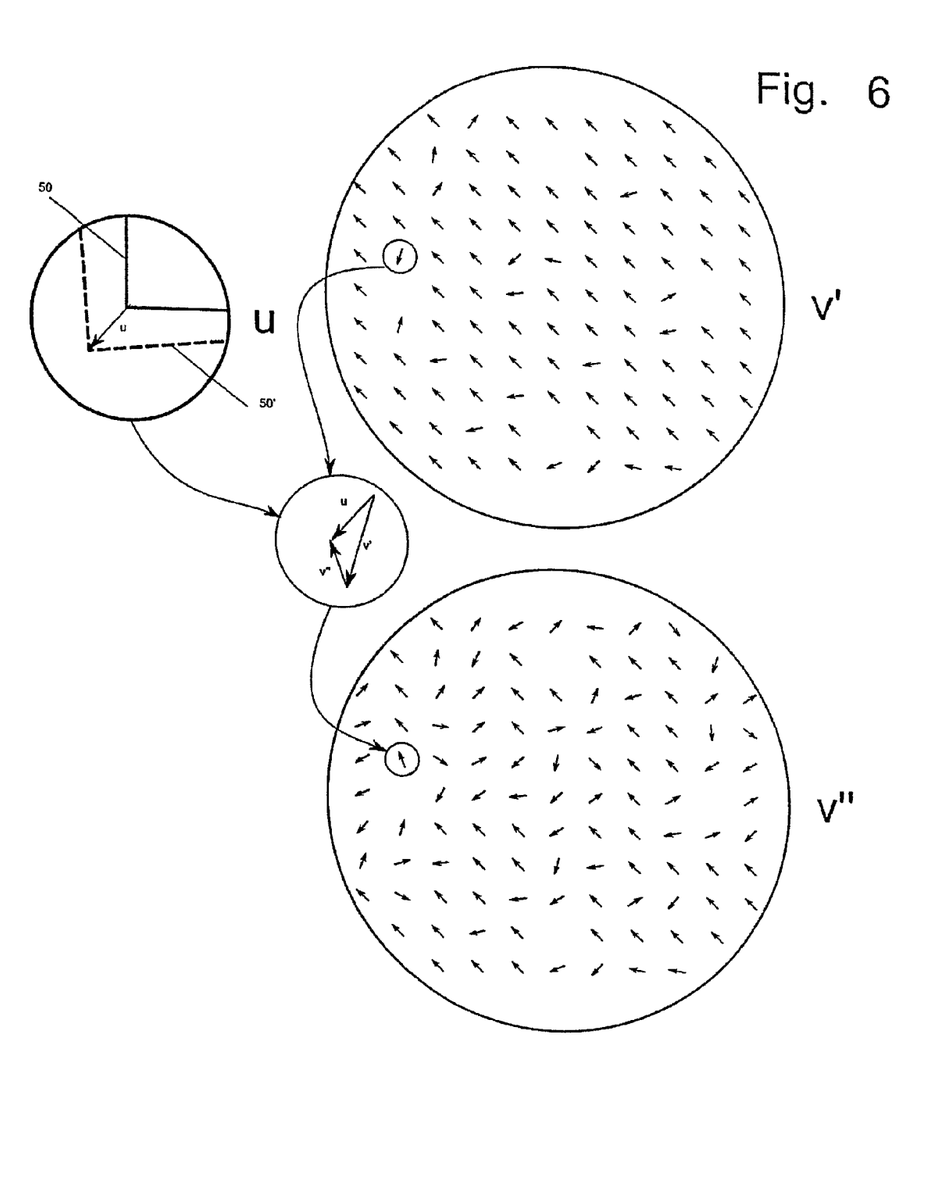

FIGS. 4 and 6 show a difference vector u which constitutes the difference of the X-Y positions of the corners of an upper structure 50 from those of a corresponding lower structure 50'. The difference vector u arises for example from the minimization computation of the position maps. Of course in each of the transparent regions 40 its own difference vector u can be recognized. If at this point the two wafers approach one another, the difference vectors u are continuously checked. If they change, during the approach or during contacting or bonding, a deviation from the determined relative position of the two wafers 1, 2 to one another takes place. Even if the two wafers 1, 2 make contact, the optics 7 can still check at least the four difference vectors u through the transparency regions 40. If after contact a deviation should be effected which is too large, the wafers 1, 2 are immediately separated in order to carry out alignment and the prebond process again. In order to implement a simultaneous checking of several transparency regions 40, for each transparency region 40 there is its own optics 7 so that the throughput during bonding is not reduced by the in-situ detection of the alignment.

Alternatively it is also conceivable as claimed in the invention to carry out the checking step after pre-bonding in a separate module, so that the throughput of the alignment means and of the pre-bonding module is not reduced. The possible separation of the wafers after the checking step can take place either in the module intended for checking or however likewise in a separate module. It is also conceivable that not all modules are connected in a single device, but form separate devices, especially with wafer handling means which are separate at the time.

FIG. 3 shows in an enlargement the near region of the alignment marks 3.1 and 4.1. In order to be able to detect the structures 50 and 50' during superposition, only the edges have been shown. If at this point the structures 50 and 50' were oriented perfectly to one another, and perfectly to the alignment marks 3.1 and 4.1, a perfect covering of the two structures 50 and 50' would be established in a bond process.

FIG. 4 shows the sample case in which there is no coverage of the structures 50 and 50', although the alignment marks 3.1 and 4.1 have been perfectly aligned to one another. In the enlargement of the structure 50 and the corresponding structure 50' it is recognizable that the difference vector u has one X- and one Y-component which can be used for vector computation.

An important component of this invention consists in that the aforementioned measurement instruments or measurement instruments provided in a separate module can be used for stress and/or strain measurement after prebonding or bonding in order to determine the stress and/or strain maps of the bonded wafer stack. By measuring the initial stress and/or initial strain maps of the wafers 1, 2 before bonding of the two wafers 1, 2 to the wafer stack and the measuring the stress and/or strain maps of the wafer stack, conclusions can be drawn about the deformation at the instant of contact or shortly afterwards can be drawn. In other words, therefore the stress introduced by the pre-bonding process can be measured and the resulting stress/distortion can be determined/estimated/predicted or advantageously computed, especially based on empirically determined relationships.

Although the inner regions of the wafers 1, 2 can no longer be viewed with the optics 7, 8, since there are no transparent regions in this region, conclusions can be drawn about the state, the position or the deformation in this region by the strain and/or stress maps. If for example in one region a stress prevails which exceeds a critical value, for example the value of a comparison stress, this region can be automatically marked as a problem zone by software. The dices could thus be divided into quality classes. Dices with low inherent stresses have a good quality class as well as long service life, while dices with high stress concentration can be classified into a low quality class.

Based on these stress/strain maps, for the entire wafer surface and all structures present on it the alignment accuracy which has been achieved is estimated and empirically determined. This can be done as follows in practice.

1) Detecting the first and second position maps, corresponding to the first and second wafers as described above.

2) Computing the ideal alignment position based on this first and second position map according to technical and/or economic criteria. This computation likewise yields the ideal alignment positions and the corresponding deviation vectors for the alignment marks in the transparent regions 40. That is, the alignment marks in the transparent regions 40 need not necessarily be perfectly aligned in order to achieve the optimum result viewed for the entire wafer. Furthermore, based on this computed desired alignment position a two-dimensional difference vector field v' which can be expected for this reason (see FIG. 6) with individual difference vectors for at least the predominant number, preferably all positions contained in the position maps, is computed. Here preferably sites at which there are no structures 50, 50' are left out in order not to adulterate the measurement result. They are for example the locations of the alignment keys 3.1 to 3.4 and 4.1 to 4.4 since there are alignment marks there instead of structures 50, 50'.

3) Detecting the first and second initial stress map corresponding to the first and second wafer before the pre-bonding step, especially parallel to detection of the first and second position map.

4) Pre-bonding of wafers with a suitable method. These methods are known in basic form to one skilled in the art for the most varied bonding connections.

5) Detecting the actual alignment accuracy in the transparent regions 40 and determining the actual deviation vectors u in the transparent regions 40.

6) Determining the difference between the actual deviation vectors u from the computed deviation vectors for the transparent regions.

7) With consideration of the determined difference the resulting difference vector map v" can be computed in which for at least the predominant number, especially for each position contained in the first and second position map, there is a deviation vector. These deviation vectors u which correspond to the individual position are now adapted by a correction vector which is computed for each individual position based on the deviation vectors determined under item 6 and the coordinate position of the respective point and the coordinate positions of the transparency fields.

8) Detecting the first and second stress map after pre-bonding.

9) Comparing the first stress map before and after the pre-bonding and the second stress map before and after the pre-bonding.

10) Predicting the additional alignment errors/deviation vectors which can be expected for individual points based on the stress differences before and after the pre-bonding.

11) Adding the additional deviation vectors caused by the stress introduced in the pre-bonding to the deviation vectors which can be theoretically expected and which were computed in point 7.

12) Deciding whether the alignment accuracy to be expected here [in] the vector field predicted based on the computation in point 11 for the deviation vectors in the individual points corresponds as before to technological and economic success criteria or whether reprocessing/separation of the wafers is to be carried out.

For wafer stacks in which one or both wafers before pre-bonding have only low or especially no initial stresses or for which the initial stress before bonding is known because it is subject for example to only very low variance in mass production, on step 3, the detection of stress maps before bonding for purposes of optimization of the throughput and the costs can be omitted. It is also possible as claimed in the invention, especially in the case of stresses which are subject to only a low variance to subject only one part of the wafer to detection of the stress maps before bonding. In this connection, low stresses are defined as stress values which are insignificant compared to the stresses produced in the pre-bonding step. This is especially the case when the stresses differ by the factor 3, preferably by the factor 5 or even better by the factor 10. With respect to only partial measurement of the wafer stack it is especially feasible for example to subject the first and the last wafer stack of a batch to inspection and for the remaining wafer stacks to adopt the stress map determined for the first wafer stack for the computations. It is also conceivable to carry out the computations offset in time in order to then base the computation on the averaged stress maps for example for the first and last wafer stack. In this case it is also advantageously possible to additionally inspect other wafer stacks in order to achieve higher reliability in the computation of the average value. According to the described procedure it is also possible to subject only one of the two wafers which form the wafer stack to detection of the stress maps. This is especially advantageous when only one of the two wafers does not meet the above described criteria which justify the omission of stress map detection.

For applications in which only one of the two wafers is structured the method can proceed similarly to bonding of two structured wafers. Specifically the process is as follows in this embodiment:

1) Detecting the already existing distortion/deviation vectors of the individual exposure fields located on the structured wafer from the ideal shape by suitable detection means. In particular step and repeat exposure system which are also intended for later processing of the bonded wafer enable this measurement with the aid of suitable devices such as test masks. This deviation from the ideal shape is represented in the form of a vector field and is stored for further computation. In particular this vector field contains vectors for a major part, especially all positions of the alignment marks, which are conventionally located on the corners of the exposure fields.

2) Detecting the initial stress map of the structured wafer before the pre-bonding process by suitable detection means from the side opposite the contact surface 1k (if wafer 1 is the structured wafer) or 2k (if wafer 2 is the structure wafer).

3) Alignment of the two wafers to one another with the aid of suitable detection means for the wafer position and alignment means.

4) Pre-bonding of the two wafers.

5) Detecting the stress map of the structured wafer after the pre-bonding step by means of suitable detection means from the side opposite the contact surface 1k/2k.

6) Determining the difference between the stress map before the pre-bonding step and after the pre-bonding step.

7) Deriving the distortion vectors to be expected/the distortion vector field to be expected based on the stress difference determined in point 6. Advantageously the vectors in this vector field are determined for positions which correlate with the positions of the vectors from the vector field which has been determined in point 1, especially at least largely agree. Advantageously this agreement is better than 500 µm, but more ideally better than 200 or 70 µm.

8) Adding the distortion vector field with the vector field determined in point 1.

9) Checking whether the vector field resulting from the computation in point 8 corresponds as before to technological and economic success criteria or whether separation and reprocessing of the wafers are to take place.

The aforementioned statements with respect to omitting the detection of stress maps before bonding or the only partial detection of the stress maps for selected wafers and/or wafer stacks apply analogously here.

Deriving the distortion vector field from the stress maps and especially the maps for the stress difference between, prior to and after pre-bonding can take place as claimed in the invention based on a plurality of suitable methods. It is apparent from the detection of stress maps and especially the stress difference beforehand/afterwards whether in certain regions of the wafer a pressure or tensile stress during bonding has been additionally produced. On this basis conclusions can be drawn about the direction of the individual vectors at any point of the wafer. The level of the stress difference in the individual regions which is likewise known from the measurements and/or the computation allows conclusions about the amount of the vector. These relationships are however not necessarily linear since the individual component regions of the wafer are conventionally surrounded by other regions which additionally influence the strain/distortion of the wafer. Therefore complete computation models which are suitable in practice must be used to be able to estimate the actual amounts and directions of the vectors. Another possibility for certain outline conditions (certain stress values, etc.) is also the use of empirical methods in which the findings from tests done in the past are exploited.

Figure 5A:
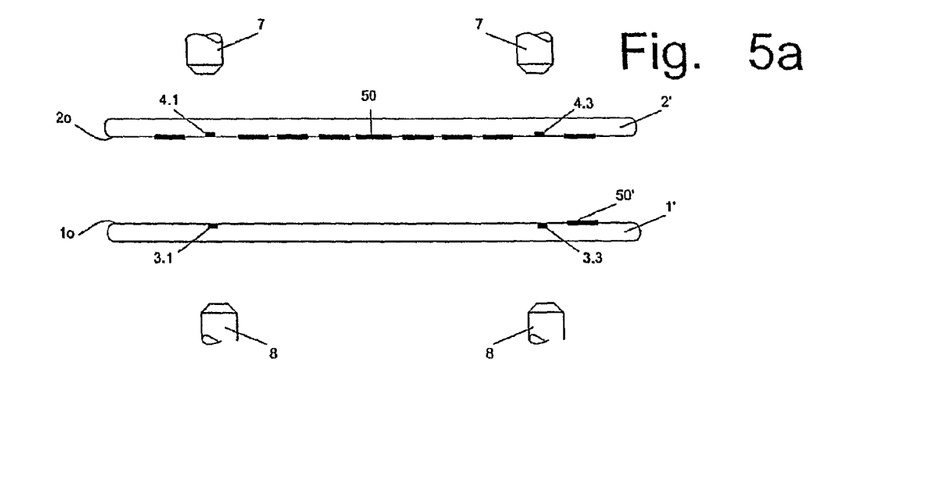
FIGS. 5a to 5c show one alternative method for detecting the alignment of a wafer pair and FIG. 6 shows a schematic of the determination of a displacement map as claimed in the invention.
Figure 5B:
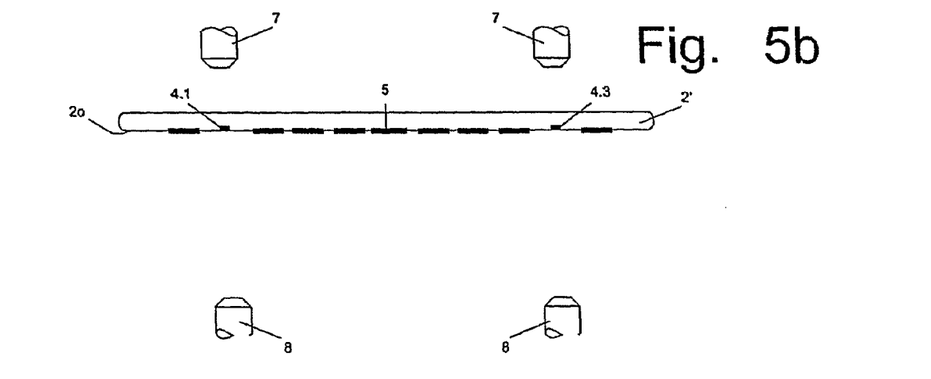
Figure 5C:
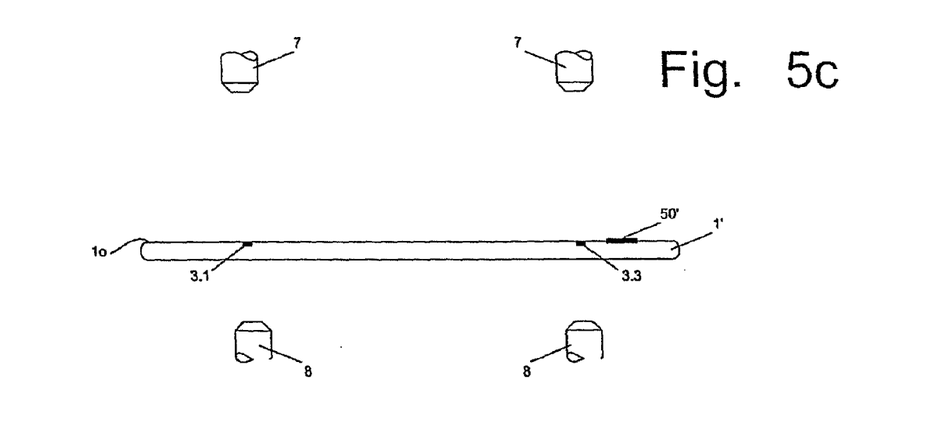

Without transparent regions 40 the in-situ measurement of the alignment during contacting and/or bonding is limited to the measurement of the strain and/or stress fields, as is shown in FIGS. 5a to 5c. The examples of FIGS. 5a to 5c show a method and a device in which instead of two wafers 1, 2 which are both completely structured, one structure wafer 2' is aligned relative to a carrier wafer F.

The alignment marks 3.1 to 3.n are correlated with the alignment marks 4.1 to 4.n by already known optical systems being used. The optics 7 and/or 8, if they have the corresponding sensor means which were mentioned above, can be used for measurement of the strain and/or stress fields. The stress and/or strain field on the top 2o of the wafer 2 can be measured either by the optics 8 while the carrier wafer 1 has been removed from the visual region (FIG. 5b) or by the optics 7, if the electromagnetic radiation used can penetrate the structure wafer 2'. It must be considered by the computation means that in the transmission measurement by the optics 7 an averaged strain and/or stress value can be obtained if the stress along the layer thickness changes (so-called stress gradients in the layer thickness). For the measurement of the strain and/or stress fields on the surface 1o of the carrier wafer 1', the above described applies, the necessary changes having been made, according to FIG. 5c.

After the respective initial strain and/or stress fields have been measured, the two wafers 1', 2' can be aligned and bonded. After the bond is completed, the strain and/or stress fields are determined by means of the optics 7 and/or 8. After bonding, only one more transmission measurement of the strain and/or stress fields of the surfaces 1o, 2o is possible since the electromagnetic radiation must penetrate the two wafers 1', 2'. Therefore the aforementioned differentiation between transmission and reflection measurement is preferred. For better comparability as claimed in the invention the transmission measurement is preferred. If transmission measurements and reflection measurements should yield similar strain and/or stress maps, it can be concluded that the strain and/or stress fields are only on the surfaces 1o, 2o and there are no stress gradients over the thickness. The beforehand/afterwards comparison then in turn allows a conclusion about the change of the strain and/or stress fields and a conclusion about possible weaknesses of the system. If extreme strain and/or stress regions or those exceeding a comparison value are discovered, the wafer system can again be broken down into the individual wafers before they are permanently bonded to one another.

For structured wafers which are not transparent to the electromagnetic waves used to detect the stress maps, a reflection measurement can be preferred since thus the transparency of the structured surface of the wafer, especially the contact surface 1k or 2k, does not play a part. For these wafers with the absence of transparency the stress can also be advantageously measured on the surfaces opposite the surfaces 1o and 2o. In order to achieve better comparability of the measurement results, it is a good idea to measure both before and after the pre-bonding and/or the bonding step on these surfaces. Since the stress fields in the wafer viewed in the lateral direction compared to the wafer thickness have a must larger extension, this version of the measurement also yields very good results. In particular, the circumstance that lateral stress fields with a certain minimum extension are needed to cause significant distortions benefits the accuracy. It can be expected that stress fields in the lateral direction (X/Y) must have at least 3 to 5 times, probably even 10, 15 or 20 times the extension relative to the wafer thickness to lead to relevant strains/distortions.

The most important wafer material combinations which can be used as claimed in the invention are: Cu—Cu, Au—Au, hybrid bonds, Si, Ge, InP, InAs, GaAs; and combinations of these materials and the respectively assignable oxides for materials which allow this.

The position, strain and stress maps all relate advantageously to the same X-Y coordinate system. Thus the vector computation is simplified, especially in the determination of the first and second alignment positions and the determination of the displacement map according to FIG. 6.

Having described the invention, the following is claimed:

1. Apparatus for determining local alignment errors which have occurred due to strain and/or distortion of a first substrate relative to a second substrate when the first substrate is joined to the second substrate with the following features:

detection means for detecting one or more of the following:
a first strain map of strain values along a first contact surface of the first substrate, a first stress map of stress values along the first contact surface, a second strain map of strain values along a second contact surface, a second stress map of stress values along the second contact surface can be detected by the detection means, and evaluation means for evaluating the first and second strain maps and the first and second stress maps for determining local alignment errors.

2. Apparatus as claimed in claim 1, wherein said evaluation means is made to take into account the first position maps of first alignment keys and second position maps of second alignment keys, especially in the determination by the evaluation means.

3. Device for determining local alignment errors which have occurred due to strain and/or distortion of a first substrate relative to a second substrate when the first substrate is joined to the second substrate comprised of:

initial detection means for detecting one or more of the following:

a first initial strain map of strain values along a first contact surface of the first substrate, a first initial stress map of stress values along the first contact surface and initial detection means for detecting one or more of the following:

a second initial strain map of strain values along a second contact surface, and a second initial stress map of stress values along the second contact surface can be detected by initial detection means and the first and second initial strain maps and the first and second initial stress maps can be taken into account by the evaluation means in the determination of the local alignment errors.

4. Device for joining a first contact surface of a first substrate which can be accommodated on a first platform with a second contact surface of a second substrate which can be accommodated on a second platform, said device for joining including:

position detection means for detecting one or more of the following:

a first position map of first alignment keys which are located along the first contact surface, a second position map of second alignment keys which are located along the second contact surface can be detected by position detection means, detection means for detecting one or more of the following:

a first strain map of strain values along a first contact surface of the first substrate, a first stress map of stress values along the first contact surface a second strain map of strain values along a second contact surface a second stress map of stress values along the second contact surface can be detected by the detection means, and evaluation means for evaluating the first and second strain maps and the first and second stress maps for determining local alignment errors computation means for determining a first alignment position of the first contact surface and a second alignment position of the second contact surface based on values of the first position map and the values of the second position map alignment means for alignment of the first contact surface into the first alignment position and of the second contact surface into the second alignment position, and means for connecting the first and second substrate.

5. Device as claimed in claim 4, wherein there are detection means for checking the first and/or second alignment positions during joining of the substrates, especially in-situ.

6. Device as claimed in claim 5, wherein checking takes place through transparent regions of the first substrate and of the second substrate.

7. Device as claimed in claim 5 or 6, wherein there are at least two, preferably four corresponding alignment keys at a time for checking.

8. A method for determining local alignment errors which have occurred due to strain and/or distortion of a first substrate relative to a second substrate when the first substrate is joined to the second substrate, said method comprised of the following steps, especially the following sequence:

detecting a first strain map of strain values along a first contact surface of the first substrate and a first stress map of stress values along the first contact surface by detection means and detecting a second strain map of strain values along a second contact surface and a second stress map of stress values along the second contact surface by detection means and evaluating the first and second strain maps and the first and second stress maps by evaluation means and determination of local alignment errors.

9. Method as claimed in claim 8, wherein in the evaluation first position maps of first alignment keys and second position maps of second alignment keys, are considered especially in the determination.

10. Method as claimed in claim 8 or 9, wherein there are the following additional steps:

detecting a first initial strain map of strain values along a first contact surface and a first initial stress map of stress values along the first contact surface by initial detection means before joining and detecting a second initial strain map of strain values along the second contact surface and a second initial stress map of stress values along the second contact surface by the initial detection means before joining and taking into account the first and second initial strain maps and the first and second initial stress maps by evaluation means in the determination of local alignment errors.

11. Method as claimed in claim 8, wherein there are the following further steps:

detecting a first position map of first alignment keys located along the first contact surface by position detection means before joining, detecting a second position map of second alignment keys located along the second contact surface by position detection means before joining, determining a first alignment position of the first contact surface and a second alignment position of the second contact surface based on values of the first position map and the values of the second position map by computation means, alignment of the first contact surface into the first alignment position and of the second contact surface into the second alignment position by alignment means and joining of the first and second substrate.

12. Method as claimed in claim 8, wherein there is the following further step:

checking the first and second alignment positions during joining of the substrates, especially in-situ, by detection means, especially through transparent regions of the first substrate and of the second substrate.

13. Use of an apparatus as claimed in claim 1 or of the device as claimed in claim 4 for bonded wafers which can be reworked or which are to be reworked.

14. Use of the method as claimed in claim 8 for bonded wafers which can be reworked or which are to be reworked.

* * * * *